(12) United States Patent
Kerber

(10) Patent No.: US 6,433,387 B1
(45) Date of Patent: Aug. 13, 2002

(54) LATERAL BIPOLAR TRANSISTOR

(75) Inventor: Martin Kerber, München (DE)

(73) Assignee: Siemens Aktiengesellschaft, Munich (DE)

( * ) Notice: Subject to any disclaimer, the term of this patent is extended or adjusted under 35 U.S.C. 154(b) by 1141 days.

(21) Appl. No.: 08/836,960

(22) PCT Filed: Nov. 21, 1995

(86) PCT No.: PCT/DE95/01623

§ 371 (c)(1),
(2), (4) Date: May 22, 1997

(87) PCT Pub. No.: WO96/16446

PCT Pub. Date: May 30, 1996

(30) Foreign Application Priority Data

Nov. 24, 1994 (DE) .......................................... 44 41 897

(51) Int. Cl.[7] .......................... H01L 27/01; H01L 27/12

(52) U.S. Cl. ...................... 257/347; 257/767; 257/915; 257/751; 257/518; 257/554; 257/587; 257/588; 257/634; 257/639; 257/640; 257/646

(58) Field of Search ................................ 257/347, 767, 257/915, 751, 518, 554, 587, 588, 639, 640, 646

(56) References Cited

U.S. PATENT DOCUMENTS 5,355,015 A * 10/1994 McFarlane et al. ......... 257/554
5,479,047 A * 12/1995 Liao et al. .................. 257/587

FOREIGN PATENT DOCUMENTS

| DE | 36 31 425 A1 | 4/1987 | |
|---|---|---|---|
| EP | 0 168 125 | 1/1986 | |
| EP | 0 619 612 A2 | 10/1994 | |
| JP | 61-242072 | * 10/1986 | ................. 257/588 |

OTHER PUBLICATIONS

1991 Symposium On VLSI Technology, Digest of Technical Papers, May 28–30, 1991, N. Higaki et al, A Thin–Base Lateral Bipolar Transistor Fabricated on Bonded SOI, pp. 53–54.

IEEE Transactions on Electron Devices, vol. 36, No. 2, Feb. 1989, Takashi Hori et al, Electrical and Physical Properties of Ultrathin Reoxidized Nitrided Oxides Prepared by Rapid Thermal Processing; pp. 340–350.

IEDM 90, (1992), Toyota Morimoto et al, Effects of Boron Penetration and Resultant Limitations in Ultra Thin Pure –Oxide and Nitrided–Oxide Gate–Films, pp. 429–432.

IEEE Transactions on Electron Devices, vol. 40, No. 12, Dec. 1993, *Briefs* —Bengt Edholm et al, A Self–Aligned Lateral Bipolar Transistor Realized on Simox–Material, pp. 2359–2360.

* cited by examiner

*Primary Examiner*—Nathan Flynn
(74) *Attorney, Agent, or Firm*—Schiff Hardin & Waite

(57) ABSTRACT

Lateral bipolar transistor, in which a thin diffusion barrier (4) is applied to a base region (10) between an emitter region (9) and a collector region (11), and there is present, on said barrier, a base electrode (8) which is provided for low-resistance supply, is connected to a heavily doped base terminal region and consists of polysilicon, for example, into which dopant is diffused out from said base terminal region.

3 Claims, 1 Drawing Sheet

LATERAL BIPOLAR TRANSISTOR

BACKGROUND OF THE INVENTION

The present invention relates to a lateral bipolar transistor, in particular on a SOI substrate.

Bipolar transistors are an essential component in integrated circuits on an SOI substrate which are produced in the context of a biCMOS process. A fundamental problem with lateral bipolar transistors is the relatively high terminal resistance at the base. Given a lateral arrangement of the emitter, base and collector, the base is a narrow strip between the emitter and the collector. It is usually necessary to make contact with this narrow strip at the end, that is to say laterally with respect to the longitudinal direction of the transistor, by means of a heavily doped terminal region. With this structure, the base current flows through the relatively high-resistance base. The sheet resistance of the base is limited by the boundary conditions resulting from the required current gain. It is not possible to achieve a sheet resistance better than about 10 to 20 kohm/sq. A direct low-resistance base terminal, for example by means of polysilicon applied to the base region, fails because of the rapid diffusion of the dopant out of this polysilicon into the semiconductor material of the base, as a result of which the charge carriers in the base region would be influenced in an uncontrollable manner. The publication by T. Hori et al., in IEEE Trans. Electron Devices 36, 340–350 (1989) and the literature cited therein investigate the electrical and physical properties of nitrided oxide layers. The publication by T. Morimoto et al. in IEDM 90, 429 –432 (1990) describes the properties of nitrided oxide layers on silicon as a diffusion barrier for boron.

SUMMARY OF THE INVENTION

The object of the present invention is to specify a lateral bipolar transistor which is suitable in particular for production in the context of a biCMOS process on an SOI substrate and has a low-resistance base supply, and a production method therefore.

In general terms the present invention is a lateral bipolar transistor having an emitter region, a base region and a collector region in a semiconductor layer and having a base terminal region. There is present, on the base region, a base electrode which is made of doped polysilicon material and which is separated from the base region by a diffusion barrier. The diffusion barrier is thin enough to enable charge carriers to pass through the diffusion barrier to a degree which suffices for the functioning of the transistor. The base electrode is electrically conductively connected to said base terminal region.

Advantageous developments of the present invention are as follows.

The semiconductor layer is mohocrystalline silicon. The semiconductor layer is a body silicon layer of an SOI substrate.

The diffusion barrier is nitride.

The present invention is also a method for producing a bipolar transistor having the following steps:

a) a region which is provided for the bipolar transistor is provided with a doping envisaged for the base region and is covered with an oxide layer;

b) a nitride layer is produced in a nitrogen-containing atmosphere at the interface between said oxide layer and the semiconductor layer;

c) using a mask, a residue of the oxide layer is removed in a region provided for the base electrode;

d) a polysilicon layer provided for the base electrode is applied and, is structured such that a portion which is provided for the base terminal region and a portion which is provided for the base electrode, which portions are connected to one another, remain and that the region provided for the base region is covered by polysilicon;

e) using masks, implantations of dopants are made for the emitter region and the collector region and also for the base terminal region;

f) the dopants which have been introduced are activated and diffusion of the dopant which has been introduced into the polysilicon out of the base terminal region into the base electrode is effected.

In a development of the method of the present invention, in step a) the oxide layer is applied to a thickness of at most 10 nm, and in step b) the nitride layer is produced with a thickness of at most 2 nm.

In the transistor according to the invention, a low-resistance base supply is realized by a base electrode which is made of polysilicon and is applied to the base region. The polysilicon is heavily doped for low resistance. A diffusion barrier situated between the actual base region and this base electrode prevents diffusion of dopant from the electrode into the semiconductor material of the base and simultaneously ensures sufficiently good electrical contact between the base electrode and the base region of the transistor. This diffusion barrier consists of silicon nitride, for example, which constitutes an efficient barrier against dopant diffusion, yet is thin enough for there to be electrical contact between the base electrode and the base region.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

The bipolar transistor according to the invention and its production are described in the following text with reference to FIGS. 1 and 2, which show intermediate stages of the transistor according to the invention after different steps of the production method, in cross-section.

DESCRIPTION OF THE PREFERRED EMBODIMENTS

Figure 1:
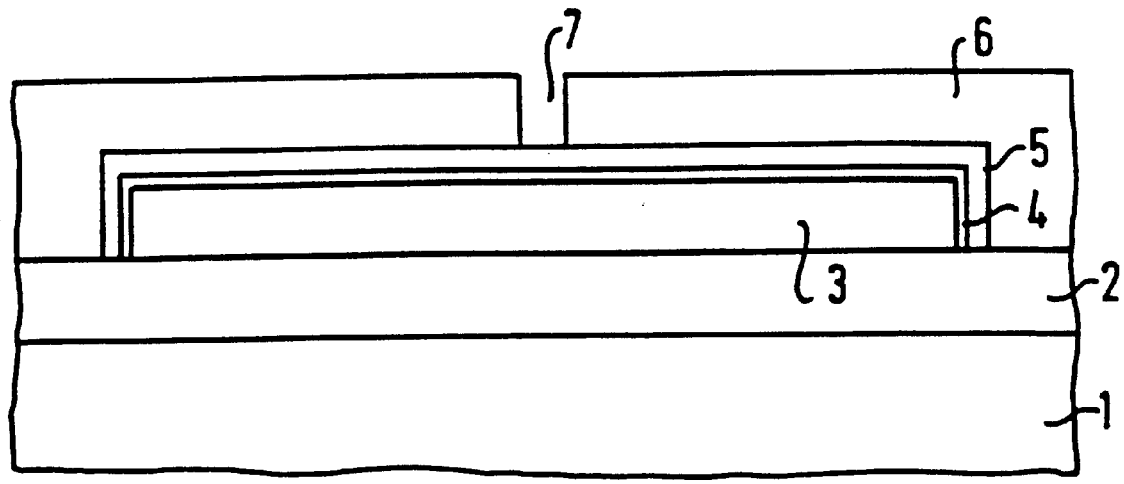

The production of the bipolar transistor according to the invention proceeds in the customary manner up until the production of the doping for the base region. In FIG. 1, the region provided for the transistor is given, as an example, by a mesa 3 as the remainder of a useful layer made of silicon (so-called body silicon layer) on an insulator layer 2 on a bulk silicon layer 1 of an SOI substrate. Instead of a mesa 3, it is also possible to provide a region which is electrically insulated all around, for example by means of LOCOS. This region, that is to say the mesa 3 in the example described, is provided with a doping envisaged for the base region. The diffusion barrier 4 is then produced as a thin layer. This is done, for example, in accordance with the method described by T. Hori, by first applying a thin oxide layer (at most approximately 10 nm) and then producing a thin silicon nitride layer (typically about 2 nm) in a nitrogen-containing atmosphere at the interface between this oxide layer 5 and the mesa 3 made of silicon. Such a diffusion barrier 4 made of silicon nitride is particularly suitable for preventing the diffusion of dopant from the polysilicon of the base electrode to be produced into the silicon of a body silicon layer in which the lateral bipolar transistor is produced.

Figure 2:
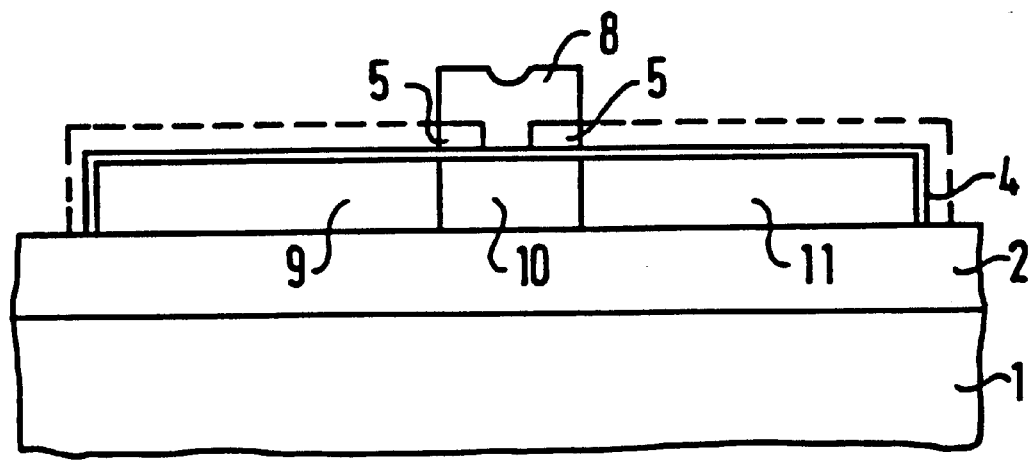

Using a mask 6 (for example a resist mask) having an opening 7 in the region of the base electrode to be produced, the residual oxide of the oxide layer 5 is removed, with the result that the surface of the diffusion barrier 4 is exposed here. During wet-chemical etching of the oxide layer 5, the diffusion barrier 4 is preserved virtually in its entire thickness owing to the high selectivity with respect to nitride. Polysilicon is then deposited into this opening in the oxide layer and subsequently structured in accordance with FIG. 2, which illustrates the base electrode 8, which is structured from the polysilicon, with residues of the oxide layer 5. The original dimension of the oxide layer 5 is depicted by dashed lines. The oxide layer 5 serves as an etch stop when the base electrode 8 is structured. The base electrode 8 can then be used as a mask for the implantation of dopants for the emitter region 9 and the collector region 11.

The polysilicon of the base electrode is structured in such a way that a relatively large terminal region made of polysilicon and connected to the base electrode 8 is situated laterally. Dopant is implanted into this terminal region using a mask, which covers the actual transistor, that is to say, in particular, the emitter region 9 and the collector region 11, the dose being selected to be high enough to enable a low-resistance supply from a contact, which is applied to this terminal region, into the base electrode 8, and, moreover, in a heat-treatment step for activating the dopant, for dopant to diffuse out of the terminal region into the base electrode 8 to the extent that is necessary for a low-resistance supply into the base region 10. The base electrode 8 is then doped for the conduction type of the base region 10.

When the dopants are activated, the diffusion barrier 4 between the base electrode 8 and the base region 10 prevents further diffusion of the dopant from the polysilicon of the base electrode into the silicon of the base region 10. However, the diffusion barrier 4 is thin enough to enable the charge carriers to pass virtually unhindered from the base electrode 8 into the base region 10 (tunnel effect), thereby giving a small base supply resistance.

The invention is not limited to the particular details of the method and apparatus depicted and other modifications and applications are contemplated. Certain other changes may be made in the above described apparatus without departing from the true spirit and scope of the invention herein involved. It is intended, therefore, that the subject matter in the above depiction shall be inter-pretend as illustrative and not in a limiting sense.

What is claimed is:

1. A lateral bipolar transistor comprising: an emitter region, a base region and a collector region in a semiconductor layer; a base terminal region; on said base region, a base electrode which is made of doped polysilicon material and which is separated from said base region by a nitride diffusion barrier; said diffusion region having a thickness that is thin enough to enable charge carriers to pass through said diffusion barrier such that the transistor functions; said base electrode being electrically conductively connected to said base terminal region.

2. The bipolar transistor as claimed in claim 1, wherein the semiconductor layer is monocrystalline silicon.

3. The bipolar transistor as claimed in claim 2, wherein the semiconductor layer is a body silicon layer of an SOI substrate.

* * * * *